United States Patent
Koyama et al.

[19]

[11] Patent Number: 6,094,741

[45] Date of Patent: Jul. 25, 2000

[54] VITERBI DECODING APPARATUS, METHOD FOR CONTROLLING SLIP STATE OF CONVOLUTIONAL CODE IN VITERBI DECODING APPARATUS, AND SLIP STATE CONTROL APPARATUS

[75] Inventors: Masayuki Koyama; Michiru Hori, both of Tokyo, Japan

[73] Assignee: Mitsubishi Denki Kabushiki Kaisha, Tokyo, Japan

[21] Appl. No.: 09/001,808

[22] Filed: Dec. 31, 1997

[51] Int. Cl.$^7$ .................................................. G06F 11/00
[52] U.S. Cl. ........................ 714/795; 714/704; 714/811
[58] Field of Search .................................. 714/704, 795, 714/786, 811, 812, 814, 815, 798; 395/559, 560, 555, 556

[56] References Cited

U.S. PATENT DOCUMENTS

| | | | |
|---|---|---|---|
| 3,646,517 | 2/1972 | Waters et al. .............................. | 714/811 |
| 4,959,834 | 9/1990 | Aikawa et al. .......................... | 714/798 |
| 5,745,570 | 4/1998 | Choi ........................................ | 714/798 |

FOREIGN PATENT DOCUMENTS

| | | |
|---|---|---|
| 41-92-982-C2 | 12/1992 | Germany . |
| 2-192252 | 7/1990 | Japan . |
| 7-249997 | 9/1995 | Japan . |
| 2786342 | 5/1998 | Japan . |
| WO 92/09953 | 6/1992 | WIPO . |

*Primary Examiner*—Trinh L. Tu
*Attorney, Agent, or Firm*—Burns, Doane, Swecker & Mathis, LLP

[57] ABSTRACT

In a viterbi decoding apparatus, a depuncture circuit is always synchronized with the input of a correct convolutional code irrespective of the degree of noise in the transmission path of the convolutional code. A comparator (4) makes a comparison of error numbers of slip states 1 through N stored in registers (R1) through (RN) of the register group (2), respectively, to detect a register (Rk) (k=either of 1 through N) storing the minimum error number thereby to output a minimum slip state (MINSLIP) indicating the slip state k to a slip state determination portion (5). The slip state determination portion (5) determines the minimum slip state (MINSLIP) to be a determined slip state (DSLIP) when the minimum slip state (MINSLIP) continuously indicates the same slip state M times.

11 Claims, 10 Drawing Sheets

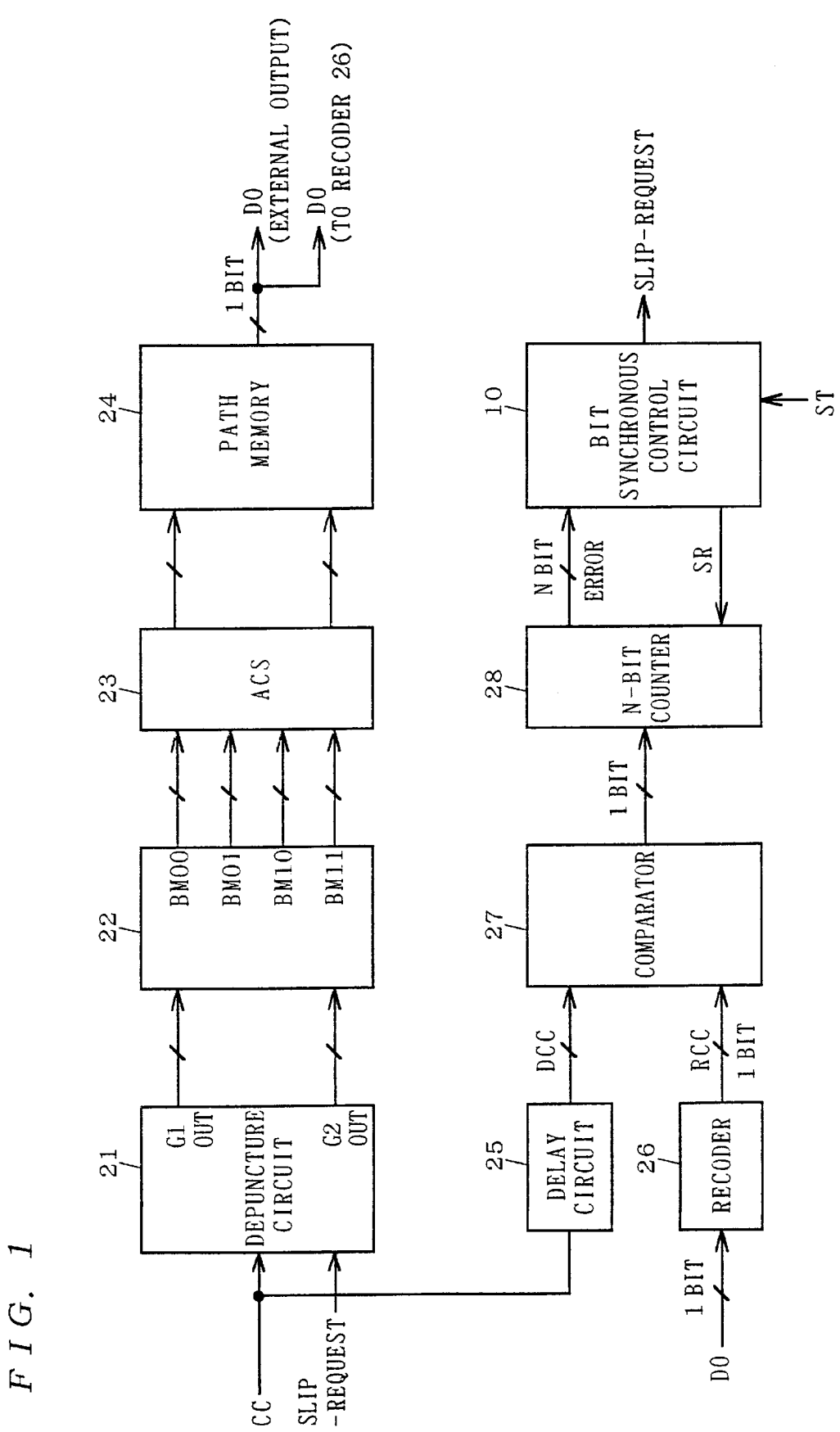
F I G. 1

FIG. 10
PRIOR ART
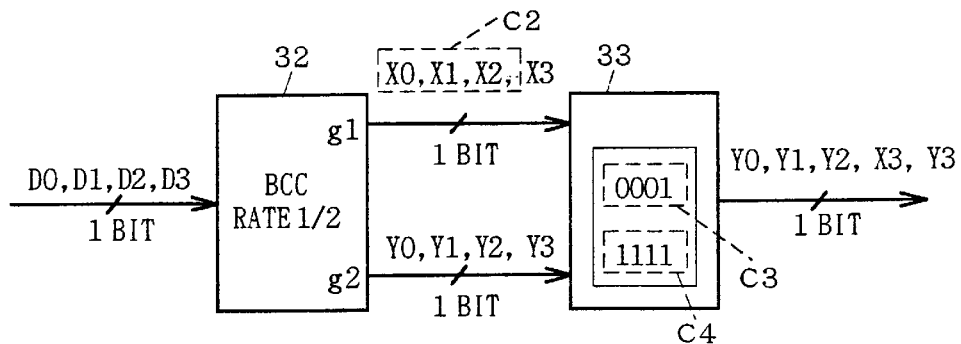
FIG. 11
PRIOR ART
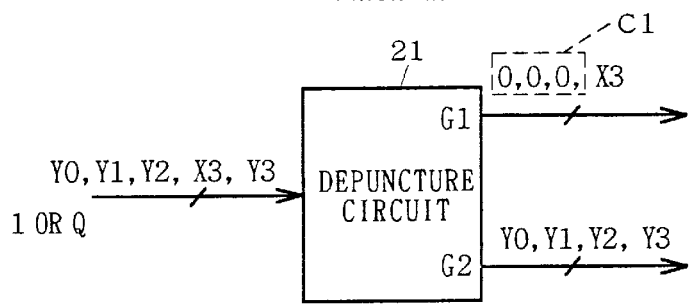
FIG. 12
PRIOR ART
(a)  ··· 0, 0, 0, X3, 0, 0, 0, X7, 0, 0 ···
     ··· Y0, Y1, Y2, Y3, Y4, Y5, Y6, Y7, Y8, Y9 ···
(b)  ··· 0, 0, 0, Y3, 0, 0, 0, Y7, 0, 0 ···
     ··· Y1, Y2, X3, Y4, Y5, Y6, X7, Y8, Y9, Y10 ···
(c)  ··· 0, 0, 0, Y4, 0, 0, 0, Y8, 0, 0 ···
     ··· Y2, X3, Y3, Y5, Y6, X7, Y7, Y9, Y10, X11 ···
(d)  ··· 0, 0, 0, Y5, 0, 0, 0, Y9, 0, 0 ···
     ··· X3, Y3, Y4, Y6, X7, Y7, Y8, Y10, X11, Y11 ···
(e)  ··· 0, 0, 0, Y6, 0, 0, 0, Y10, 0, 0 ···
     ··· Y3, Y4, Y5, X7, Y7, Y8, Y9, X11, Y11, Y12 ···

VITERBI DECODING APPARATUS, METHOD FOR CONTROLLING SLIP STATE OF CONVOLUTIONAL CODE IN VITERBI DECODING APPARATUS, AND SLIP STATE CONTROL APPARATUS

BACKGROUND OF THE INVENTION

1. Field of the Invention

The present invention is directed to a slip state of a convolutional code in a viterbi decoding apparatus.

2. Background of the Invention

FIG. 9 shows the structure of a conventional viterbi decoding apparatus. As shown in the figure, both of a depuncture circuit 21 and a delay circuit 25 input a convolutional code CC.

First, the convolutional code CC will be described. As shown in FIG. 10, a BCC (Binary Convolutional Coder) circuit 32 implements a convolutional processing of an input data (D0, D1, D2, D3) into convolutional codes (X0, X1, X2, X3) and (Y0, Y1, Y2, Y3) to be outputted from output portions g1 and g2, respectively, using a predetermined generator polynomial where a constraint length k=5 and a coding rate R=1/2.

A puncture circuit 33 deletes a convolutional code C2 (X0, X, X2) from the inputted convolutional codes (X0, X1, X2, X3) and (Y0, Y1, Y2, Y3) on the basis of delete patterns C3 (0001) and C4(1111) to finally output a convolutional code (Y0, Y1, Y2, X3, Y3) with the coding rate of 4/5.

The convolutional code CC to be inputted into the vitervi decoding apparatus is punctured by such a circuit as shown in FIG. 10.

A depuncture circuit 21 implements a depuncture processing of the convolutional code CC into depunctured codes to be outputted from two output portions G1 and G2.

When inputting the convolutional code CC (Y0, Y1, Y2, X3, Y3) (output of the puncture circuit 33 of FIG. 10) as shown in FIG. 11, for example, the depuncture circuit 21 inserts a dummy symbol C1 (0,0,0) through the output portion G1 to output a code (0, 0, 0, X3) from the output portion G1 and (Y0, Y1, Y2, Y3) from the output portion G2. These codes, parted and outputted from the two output portions G1 and G2 with the dummy symbol inserted into where a code is deleted, are depunctured codes.

For the code depunctured by the depuncture circuit 21, a branch-metric calculation circuit 22 calculates a branch metric, and for the branch metric and a path metric, an ACS circuit 23 performs an addition, comparison, and selection. Then, a path memory 24 decodes the code using a maximum likelihood value to output a viterbi decoding data D0.

The viterbi decoding data D0 is provided to an internal recoder 26 as well as the outside. For the viterbi decoding data D0, the recoder 26 implements the same processing as in the circuit shown in FIG. 10 to output a punctured convolutional code for comparison RCC. On the other hand, the delay circuit 25 delays the convolutional code CC by the total processing time of the depuncture circuit 21, the branch-metric calculation circuit 22, the ACS circuit 23, the path memory 24 and the recoder 26 to output a delay convolutional code DCC.

Comparing the convolutional code for comparison RCC and the delay convolutional code DCC in bits, a comparator 27 outputs the comparison result to an N-bit counter 28. At this stage, if the viterbi decoding code D0 has been decoded with accuracy, the comparison result agrees; if decoded in error, the comparison result partly disagrees.

The N-bit counter 28 counts a mismatch of the comparison results of the comparator 27 to output the total number of the mismatches as an (residual) error number ERROR to a bit synchronous control circuit 29.

Comparing the error number ERROR with the threshold value TH inputted from the outside, the bit synchronous control circuit 29 outputs a signal SLIP-REQUEST to change a slip state when the error number ERROR is larger than the threshold value TH, thereby to change the present slip state of the depuncture circuit 21.

Next, the slip state of the depuncture circuit 21 will be described. Since the depuncture circuit 21 implements the depuncture processing of the convolutional code CC in 5 bits, there are five ways of synchronization depending on the bit to be taken as a head bit. The five ways are classified as slip states 1 through 5 numbered on the basis of relative positions of the bit taken as a head bit. That is, the input timing of the convolutional code CC in the depuncture circuit 21 is based on a slip state to be set (hereinafter referred to as a setting slip state).

When the setting slip state is accurate, bits Y0, Y4 and Y8 are taken as the head bit, respectively, as shown in (a) of FIG. 12. Thus, the depuncture processing can be performed with the dummy symbols "0" properly inserted. On the other hand, when the setting slip state is inaccurate, the dummy symbol cannot be properly inserted as shown in (b) through (e) of FIG. 12.

If (a) of FIG. 12 indicates the slip state 1, (b) of FIG. 12 indicates the slip state 2 where bits Y1, Y5 and Y9 are taken as the head bit, respectively; (c) of FIG. 12 indicates the slip state (3) where bits Y2, Y6 and Y10 are taken as the head bit, respectively; (d) of FIG. 12 indicates the slip state 4 where bits X3, X7 and Y11 are taken as the head bit, respectively; and (e) of FIG. 12 indicates the slip state 5 where bits Y3, Y7 and Y11 are taken as the head bit, respectively.

When the error number ERROR is larger than the threshold value TH, the bit synchronous control circuit 29 judges that the depuncture circuit 21 is not properly synchronized with the input of the convolutional code CC (the conditions of (b) through (e) of FIG. 12), and then outputs the signal SLIP-REQUEST to the depuncture circuit 21 to further change a slip state.

Receiving the signal SLIP-REQUEST to change a slip state, the depuncture circuit changes the present slip state to a different one to input the convolutional code CC for the depuncture processing.

The bit synchronous control circuit 29 of the conventional viterbi decoding apparatus judges whether the depuncture circuit 21 is properly synchronized with the input of the convolutional code CC or not by making a comparison between the error number ERROR counted during a predetermined measuring time and a predetermined threshold value TH.

However, since only one type of the threshold value number TH is available in this method, if the threshold value TH is inappropriate due to the degree of noise in the transmission path, for example, it becomes difficult to properly judge whether the depuncture circuit is synchronized with the input of the convolutional code CC or not in the bit synchronous control circuit.

Not properly setting a slip state, the depuncture circuit cannot be synchronized with the input of the convolutional code, which causes an inaccurate viterbi decoding processing.

SUMMARY OF THE INVENTION

A first aspect of the present invention is directed to a viterbi decoding apparatus comprising: a decoding processing portion for inputting a punctured convolutional code the input timing of which is based on a setting slip state, to decode by a viterbi decoding method thereby to output a viterbi decoding data; a counting means for counting and outputting a decoding error number of the viterbi decoding data; and a synchronous control means for determining one of a plurality of slip states to be the setting slip state in an active state on the basis of the decoding error number. The synchronous control means includes: an error-number-by-slip-state calculation means for obtaining respective decoding error numbers of the plurality of slip states from the output of the counting means by sequentially adopting the plurality of slip states as the setting slip state for each of predetermined periods of time; and a slip state setting means for setting the setting slip state on the basis of a relative comparison of respective decoding error numbers of the plurality of slip states.

Preferably, according to a second aspect of the present invention, in the viterbi decoding apparatus of the first aspect, the counting means starts to count the decoding error number from an initial condition; the error-number-by-slip-state calculation means includes a control means for initializing the counting means for each of the predetermined periods of time, and outputting an error number calculation termination information indicating a termination of a calculation of the decoding error numbers of all the plurality of slip states upon the termination; and the slip state setting means includes: a storage portion for storing respective decoding error numbers of the plurality of slip states in one-to-one correspondence with the plurality of slip states; a comparison portion for making a relative comparison of respective decoding error numbers of the plurality of slip states stored in the storage portion to output a minimum slip state information indicating a slip state corresponding to the minimum decoding error number, when the error number calculation termination information indicates the termination of the calculation of the decoding error numbers of all the plurality of slip states; and a slip state determination portion <5> for determining the setting slip state on the basis of the minimum slip state information.

Preferably, according to a third aspect of the present invention, in the viterbi decoding apparatus of the first aspect, the counting means starts to count the decoding error number from an initial condition; the error-number-by-slip-state calculation means includes a control means for initializing the counting means for each of the predetermined periods of time, and outputting an error number calculation termination information indicating a termination of a calculation of the decoding error numbers of all the plurality of slip states upon the termination; and the slip state setting means includes: a storage portion for comparison for storing a slip state information for comparison and an error number for comparison ; a comparison portion sequentially receiving respective decoding error numbers of the plurality of slip states, for making a comparison between the decoding error number and the error number for comparison stored in the storage portion for comparison, to update the error number for comparison and the slip state information for comparison to the decoding error number and its corresponding slip state information when the decoding error number is smaller than the error number for comparison; a minimum slip state output portion for outputting the slip state information for comparison finally stored in the storage portion for comparison as a minimum slip state information, when the error number calculation termination information indicates the termination of the calculation of the decoding error numbers of all of the plurality of slip states; and a slip state determination portion for determining the setting slip state on the basis of the minimum slip state information.

Preferably, according to a fourth aspect of the present invention, in the viterbi decoding apparatus of the third aspect, the error-number-by-slip-state calculation means repeats the calculation of respective decoding error numbers of all of the plurality of slip states; and the slip state determination portion determines the slip state indicated by the minimum slip state information as the setting slip state, when the minimum slip state information continuously indicates the same slip state M times ($M \geq 1$).

A fifth aspect of the present invention is directed to a method for controlling a slip state of a convolutional code in a viterbi decoding apparatus having a plurality of slip states to be candidates for a setting slip state. The viterbi decoding apparatus comprises: a decoding processing portion for inputting a punctured convolutional code the input timing of which is based on the setting slip state, to decode by a viterbi decoding method thereby to output a viterbi decoding data; and a counting means for counting a decoding error number of the viterbi decoding data. The method comprises the steps of: (a) obtaining respective decoding error numbers of the plurality of slip states by sequentially adopting the plurality of slip states as the setting slip state for each of predetermined periods of time; and (b) setting the setting slip state on the basis of a relative comparison of respective decoding error numbers of the plurality of slip states after the step (a).

Preferably, according to a sixth aspect of the present invention, in the method for controlling the slip state of a convolutional code in the viterbi decoding apparatus of the fifth aspect, the step (a) includes the step of: (a-1) storing respective decoding error numbers of the plurality of slip states in a storage portion in one-to-one-correspondence with the plurality of slip states. Further, the step (b) includes the steps of: (b-1) making a relative comparison of respective decoding error numbers of the plurality of slip states stored in the storage portion to obtain a minimum slip state information indicating a slip state corresponding to the minimum decoding error number; and (b-2) determining the setting slip state on the basis of the minimum slip state information.

Preferably, according to a seventh aspect of the present invention, in the method for controlling the slip state of the convolutional code in the vitervi decoding apparatus of the fifth aspect, the step (a) includes the step of: (a-1) sequentially receiving respective decoding error numbers of the plurality of slip states to make a comparison between the decoding error number and an error number for comparison thereby to update the error number for comparison and a slip state information for comparison to the decoding error number and its corresponding slip state information when the decoding error number is smaller than the error number for comparison. Further, the step (b) includes the steps of: (b-1) determining the slip state information for comparison obtained after the step (a) as a minimum slip state information; and (b-2) determining the setting slip state on the basis of the minimum slip state information.

Preferably, according to an eighth aspect of the present invention, in the method for controlling the slip state of the convolutional code in the viterbi decoding apparatus of the seventh aspect, the steps (a) and (b) are repeated; and the step (b-2) includes the step of: (b-2-1) determining the slip state indicated by the minimum slip state information as the setting slip state, when the minimum slip state information continuously indicates the same slip state M times ($M \geq 1$), the minimum slip state information being obtained at every step (a).

A ninth aspect of the present invention is directed to a slip state control apparatus for controlling an input timing of a punctured convolutional code in a viterbi decoding apparatus for counting a decoding error number of a viterbi decoding data, the input timing being based on a setting slip state. The input timing control apparatus comprising: an error-number-by-slip-state calculation means for obtaining respective decoding error numbers of the plurality of slip states by sequentially adopting the plurality of slip states as the setting slip state for each of predetermined periods of time; and a slip state setting means for setting the setting slip state on the basis of a relative comparison of respective decoding error numbers of the plurality of slip states.

In accordance with the viterbi decoding apparatus of the first aspect, the slip state setting means sets the setting slit state not by the absolute comparison between the decoding error number and the threshold value as in the conventional apparatus but by the relative comparison of the respective decoding error numbers of the plurality of the slip states. Thus, the viterbi decoding apparatus can be accurately synchronized with the input of the convolutional code irrespective of the degree of noise in the transmission path of the convolutional code.

Moreover, since the predetermined period of time can considerably be shortened by setting the setting slip state on the basis of the relative comparison of the respective decoding error numbers of the plurality of slip states, early determination of the setting slip state becomes possible as compared to the conventional apparatus.

In accordance with the viterbi decoding apparatus of the second aspect, the slip state setting means includes the comparison portion for making a relative comparison of the respective decoding error numbers of the plurality of slip states stored in the storage portion to output the minimum slip state information indicating the slip state corresponding to the minimum decoding error number, and the slip state determination portion for determining the setting slip state on the basis of the minimum slip state information.

Since the setting slip state is determined on the basis of the minimum slip state information, the slip state corresponding to the minimum decoding error number out of the plurality of slip states becomes the candidate for the setting slip state. Thus, the viterbi decoding apparatus of the second aspect can be more accurately synchronized with the input of the convolutional code.

Further, since the decoding error numbers of all the slip states are stored in the storage portion in the viterbi decoding apparatus of the second aspect, the comparison portion only has to make a relative comparison one time to obtain the minimum slip state information.

In accordance with the viterbi decoding apparatus of the third aspect, the slip state setting means includes the comparison portion sequentially receiving the decoding error numbers of the plurality of slip states for making a comparison between the decoding error number and the error number for comparison stored in the storage portion for comparison thereby to update the error number for comparison and the slip state information for comparison stored in the storage portion for comparison to the decoding error number and its corresponding slip state, respectively, when the decoding error number is smaller than the error number for comparison; the minimum slip state output portion for outputting the slip state information for comparison finally stored in the storage portion for comparison as the minimum slip state information when the error number calculation termination information indicates the termination of the calculation of all the decoding error numbers of the plurality of slip states; and the slip state determination portion for determining the setting slip state on the basis of the minimum slip state information.

Since the setting slip state is determined on the basis of the minimum slip state information, the slip state corresponding to the minimum decoding error number out of the plurality of slit states becomes the candidate for the setting slip state. Thus, the viterbi decoding apparatus of the second aspect can be more accurately synchronized with the input of the convolutional code.

Besides, the storage portion for comparison only has to have a capacity for storing one set of the error number for comparison and the slip state information for comparison.

In accordance with the viterbi decoding apparatus of the fourth aspect, the slip state determination portion determines the slip state indicated by the minimum slip state information as the setting slip state, when the minimum slip state information continuously indicates the same slip state M times ($M \geq 1$). Thus, if the setting slip state becomes more reliable in proportion to the number M, the viterbi decoding apparatus can be more accurately synchronized with the input of the convolutional code.

In accordance with the method for controlling the slip state of the convolutional code in the viterbi decoding apparatus of the fifth aspect, at the step (b), the setting slip state is set not by the absolute comparison between the decoding error number and the threshold value as in the conventional apparatus but by the relative comparison of the respective decoding error numbers of the plurality of slip states. Thus, accurate synchronization with the input of the convolutional code becomes possible irrespective of the degree of noise in the transmission path of the convolutional code.

In accordance with the method for controlling the slip state of the convolutional code in the viterbi decoding apparatus of the sixth aspect, the step (b) includes the steps of (b-1) obtaining the slip state corresponding to the minimum decoding error number by the relative comparison of the respective decoding error numbers of the plurality of slip states; and (b-2) determining the setting slip state on the basis of the minimum slip state information.

According to the slip state control method of the sixth aspect, since the setting slip state is determined on the basis of the minimum slip state information, the slip state corresponding to the minimum decoding error number out of the plurality of slip states becomes the candidate for the setting slip state. Thus, more accurate synchronization with the input of the convolutional code becomes possible.

In accordance with the method for controlling the slip state of the convolutional code in the viterbi decoding apparatus of the seventh aspect, the step (a) includes the step of (a-1) sequentially receiving the respective decoding error numbers of the plurality of slip states to make a comparison between the decoding error number and the error number for comparison thereby to update the error number for comparison and the slip state information for comparison to the decoding error number and its corresponding slip state when the decoding error number is smaller than the error number for comparison. The step (b) includes the steps of (b-1) determining the slip state information for comparison to be the minimum slip state information, and (b-2) determining the setting slip state on the basis of the minimum slip state information.

According to the slip state control method of the seventh aspect, since the setting slip state is determined on the basis of the minimum slip state information, the slip state corresponding to the minimum decoding error number out of the plurality of slip states becomes the candidate for the setting slip state. Thus, more accurate synchronization with the input of the convolutional code becomes possible.

In accordance with the method for controlling the slip state of the convolutional code in the viterbi decoding apparatus of the eighth aspect, the slip state indicated by the minimum slip state is determined as the setting slip state, when the minimum slip state continuously indicates the same slip state M times (M≧1) at the step (b-2-1). Thus, if the setting slip state becomes more reliable in proportion to the number M, more accurate synchronization with the input of the convolutional code becomes possible.

In accordance with the slip state setting apparatus of the ninth aspect, the slip state setting means sets the setting slip state not by the absolute comparison between the decoding error number and the threshold value as in the conventional apparatus but by the relative comparison of the respective decoding error numbers of the plurality of slip states. Thus, more accurate synchronization with the input of the convolutional code becomes possible irrespective of the degree of noise in the transmission of the convolutional code.

An object of the present invention is to provide the viterbi decoding apparatus performing always accurately operation irrespective of the degree of noise in the transmission path of the convolutional code.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows the whole structure of a viterbi decoding apparatus in accordance with a first preferred embodiment of the present invention.

FIG. 10 shows a generating process of a convolutional code.

FIG. 11 is a block diagram showing a depuncture processing.

FIG. 12 illustrates the depuncture processing.

DESCRIPTION OF THE PREFERRED EMBODIMENTS

1. First Preferred Embodiment 1-1. Whole Structure

Figure 9:
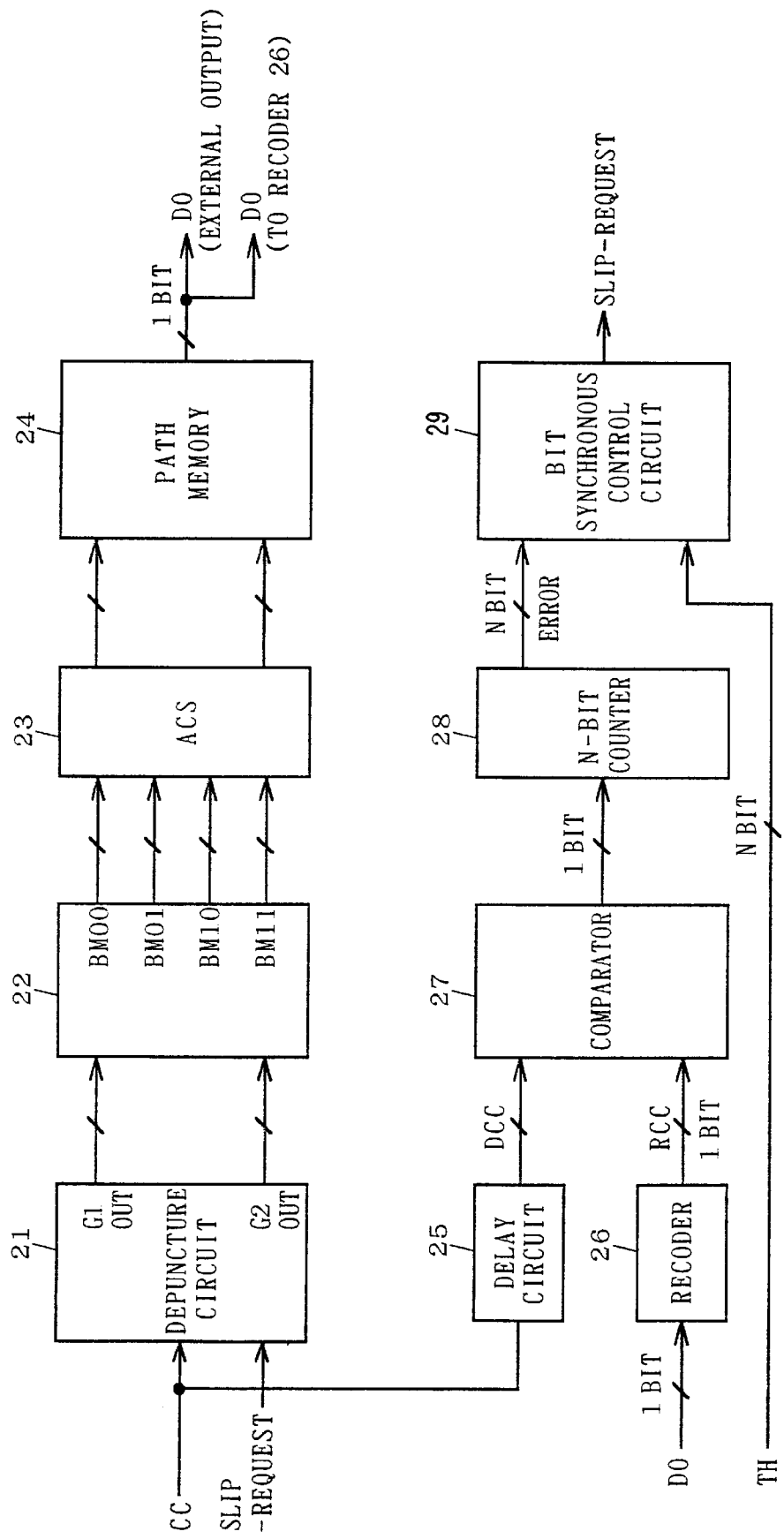
FIG. 9 shows the whole structure of a conventional viterbi decoding apparatus.

FIG. 1 shows the whole structure of a viterbi decoding apparatus in accordance with a first preferred embodiment of the present invention. As shown in this figure, a bit synchronous control circuit 10 is activated or deactivated by a control signal ST from the outside. Receiving a decoding error number (residual error number) ERROR from an N-bit counter 28, the bit synchronous control circuit 10 outputs a signal SLIP-REQUEST to a depuncture circuit 21 to change or fix a slip state, and a reset signal SR to the N-bit counter 28 to initialize the counter. The other parts of the structure is the same with that of the conventional viterbi decoding apparatus shown in FIG. 9.

1-2. Internal Structure

Figure 2:
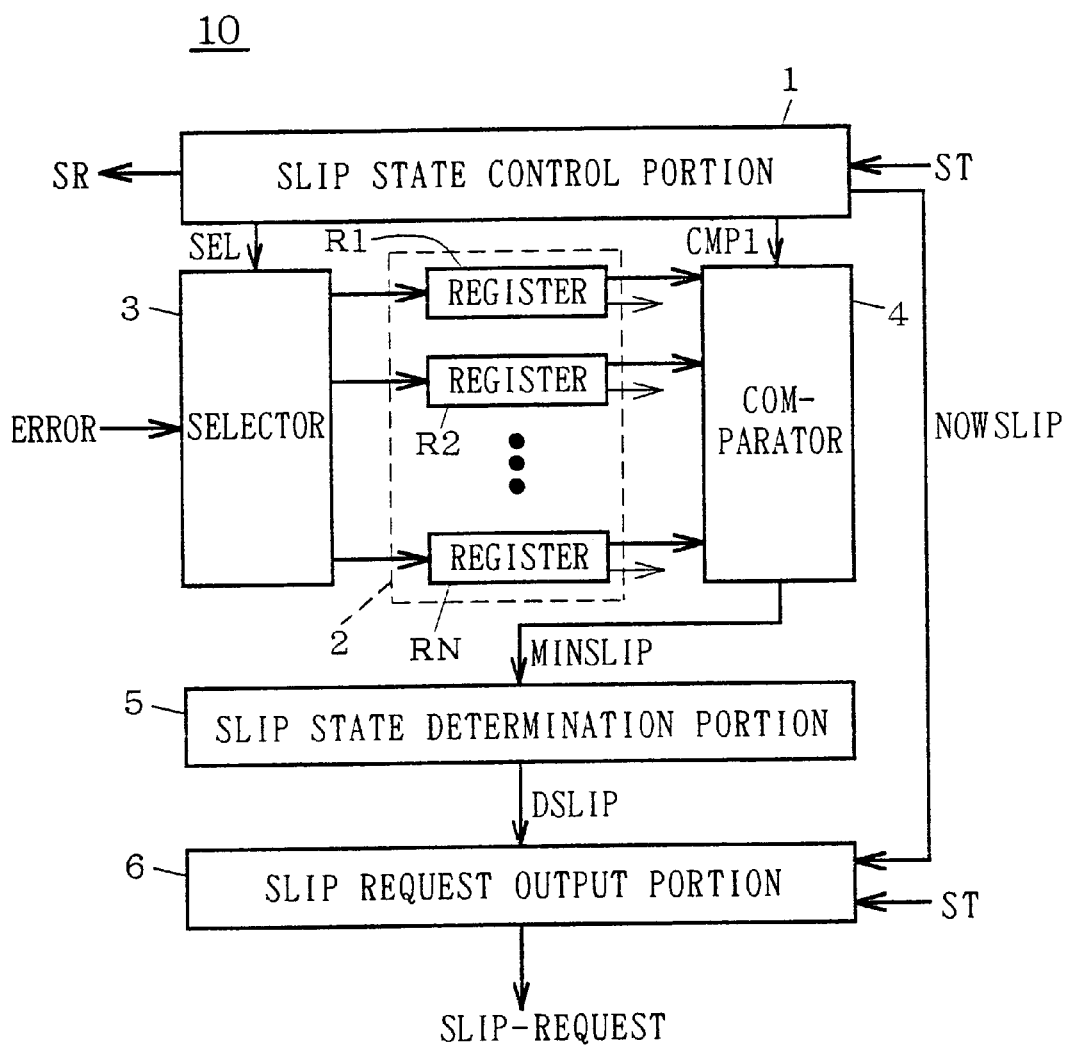
FIG. 2 shows the internal structure of a bit synchronous control circuit in accordance with the first preferred embodiment.

FIG. 2 shows the internal structure of the bit synchronous control circuit 10 of the viterbi decoding apparatus in accordance with the first preferred embodiment. The bit synchronous control circuit 10 is activated or deactivated by the control signal ST, and in the active state, always outputs a "L"-level signal SLIP-REQUEST to fix a slip state.

With the control signal ST for activation, a slip state control portion 1 having a timer (not shown) inside is activated from a predetermined initial state to output the present slip state (information) NOWSLIP indicating the present slip state to a slip request output portion 6 on the basis of the slip state which changes every measuring time TER. Further, in the active state, synchronized with a change timing of the slip state, the slip state control portion 1 outputs a selection signal SEL to a selector 3 to switch a register for storage to any of registers R1 through RN of a register group 2, and the reset signal SR to the N-bit counter 28 to initialize the counter. The slip state control portion 1 further outputs a comparison starting signal CMP1 to the comparator 4 to activate the comparator during a predetermined period of time starting from the termination of the measurement of all the slip states (enough period of time that the comparator 4 can make a comparison).

The registers R1 through RN (N≧2) of the register group 2 are provided for each of the slip states 1 through N to store the error numbers ERROR of the corresponding slip states.

The selector 3 stores the error number ERROR into a register indicated by the selection signal SEL out of the registers R1 through RN of the register group 2.

The comparator 4 activated by the comparison starting signal CMP1 for activation makes a comparison of respective error numbers stored in the registers R1 through RN of the register group 2 to detect a register Rk (k=any of 1 through N) which stores the minimum error number, thereby to output a minimum slip state (information) MINSLIP indicating a slip state k to a slip state determination portion 5. This minimum slip state MINSLIP becomes a candidate for a slip state to be set in the depuncture circuit 21 (hereinafter referred to as a setting slip state).

Receiving the minimum slip state MINSLIP, when the minimum slip state MINSLIP continuously indicates the same slip state more than M times (M≧1), the slip state determination circuit 5 determines the minimum slip state MINSLIP as a determined slip state (information) DSLIP, and outputs the DSLIP to the slip request output portion 6.

The slip request output portion 6 is activated by the control signal ST to start outputting a "H"-level signal SLIP-REQUEST to change a slip state. On the other hand, when deactivated by the control signal ST, the slip request output portion 6 always outputs a "L"-level signal SLIP-REQUEST to fix a slip state.

The "H"-level signal SLIP-REQUEST changes the slip state of the depuncture circuit 21 in every predetermined slip cycle. In this preferred embodiment, the slip cycle and the measuring time TER are set to be the same.

With the determined slip state DSLIP, the slip request output portion 6 keeps outputting the "H"-level signal SLIP-REQUEST to change a slip state until the present slip state NOWSLIP agrees with the determined slip state DSLIP. When they agree with each other, the slip request output portion 6 outputs the "L"-level signal SLIP-REQUEST to fix a slip state.

1-3. Operation

Figure 3:
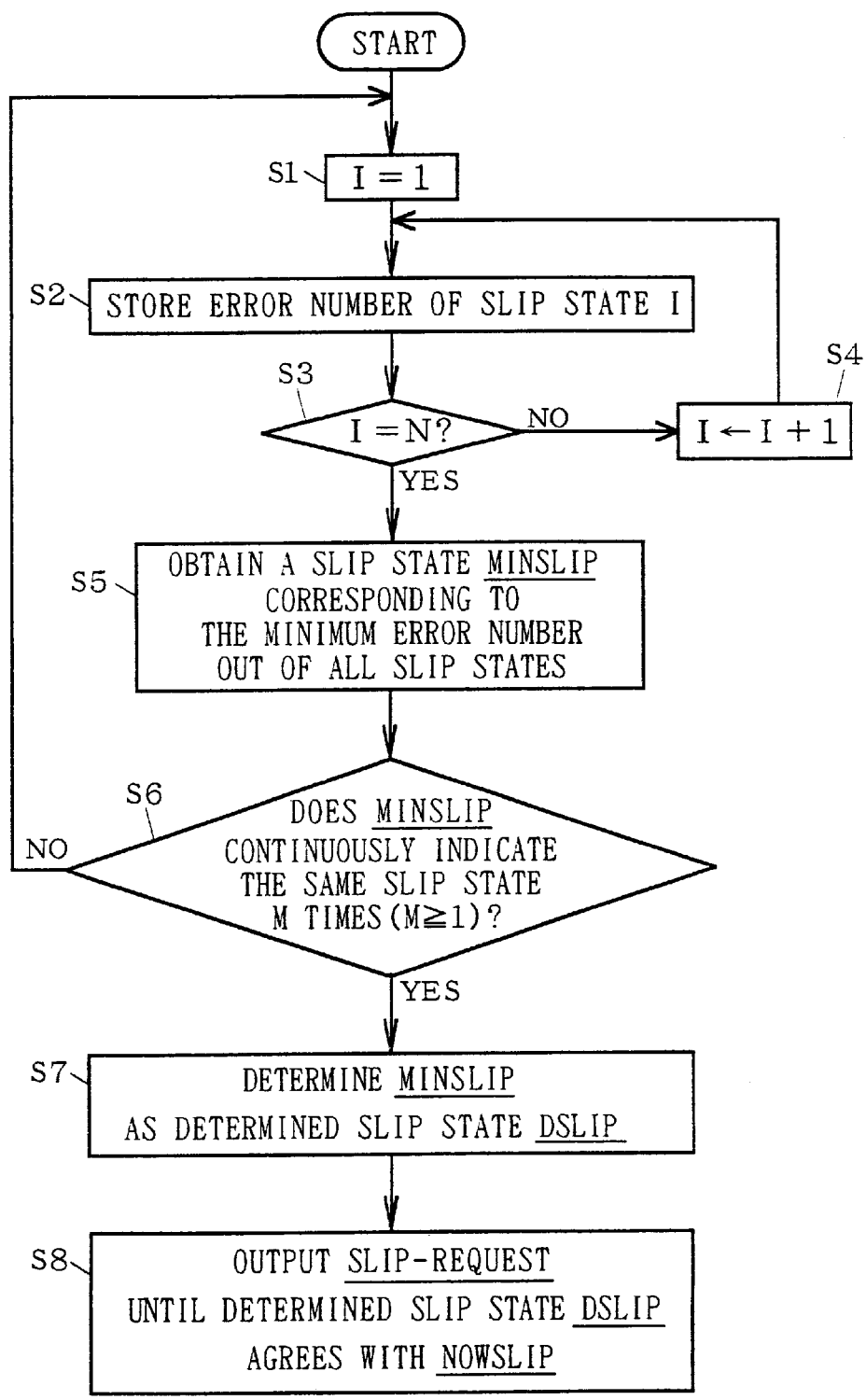
FIG. 3 is a flow chart illustrating the operation in accordance with the first preferred embodiment.
Figure 4:
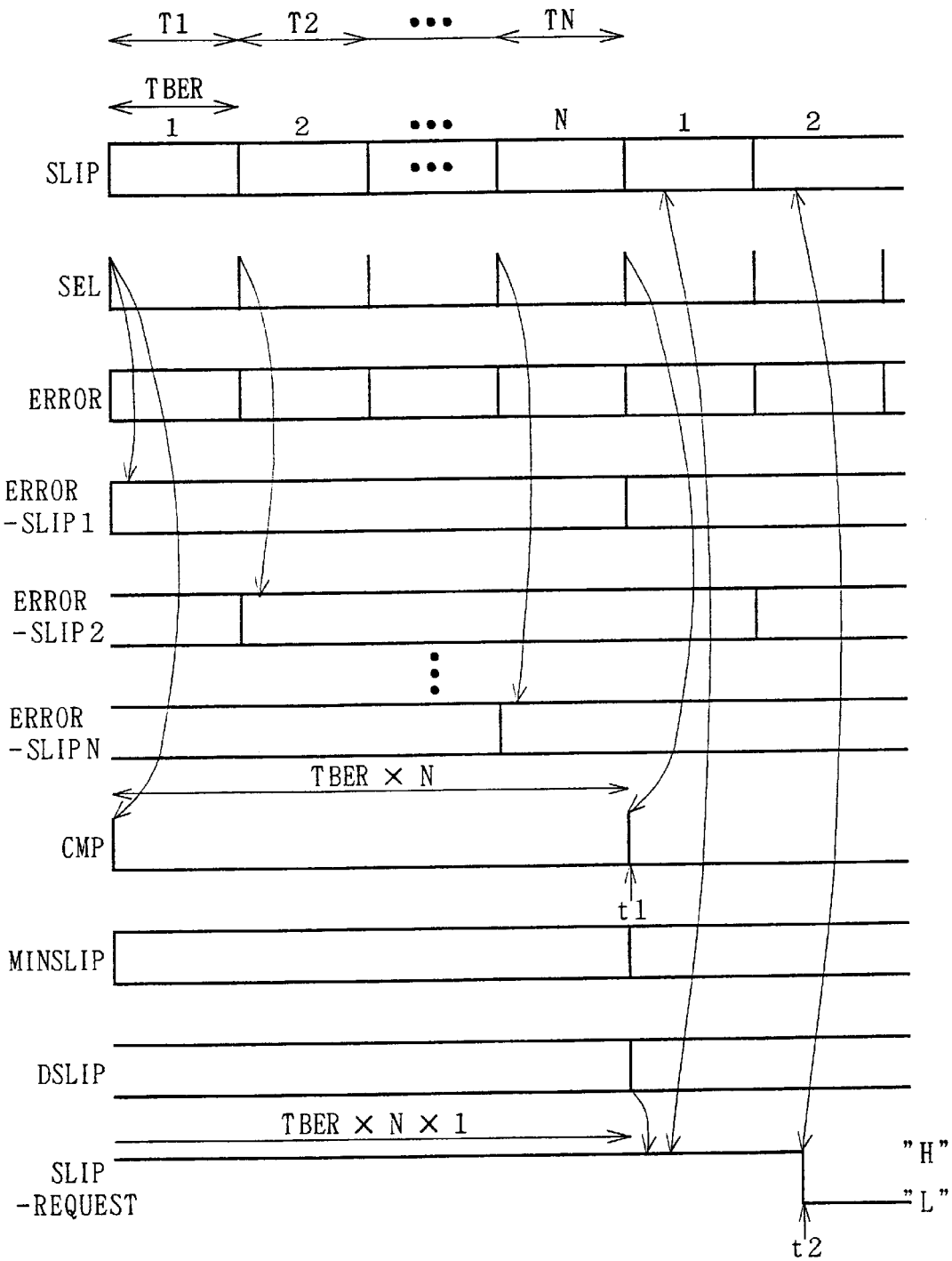
FIG. 4 is a timing chart illustrating the operation in accordance with the first preferred embodiment.

FIGS. 3 and 4 are a flow chart and a timing chart, respectively, both illustrating the operation of the bit synchronous control circuit 10 shown in FIG. 2. With reference to those figures, the operation of the active bit synchronous control circuit 10 will be described.

Initializing a slip state identification number I to "1" at a step S1, the slip state control portion 1 outputs the selection signal SEL to switch a register for storage to the register R1 corresponding to the slip state 1, and initializes the N-bit counter 28 by the reset signal SR. At the same time, the slip state control portion 1 outputs the present slip state NOWSLIP indicating the slip state 1 to the slip request output portion 6.

At a step S2, the selector 3 make a selection on the basis of the selection signal SEL so that the error number ERROR obtained from the N-bit counter 28 is stored in the register R1 of the register group 2.

In this case, since I≠N at a step S3, the identification number I is incremented by 1 at a step S4. Then, the slip state control portion 1 outputs the selection signal SEL to switch the register for storage to the register R2 corresponding to the slip state 2, and initializes the N-bit counter 28 by the reset signal SR. At the same time, the slip state control portion 1 outputs the present slip state NOWSLIP indicating the slip state 2 to the slip request output portion 6.

Again at the step S2, the selector 3 makes a selection so that the error number ERROR obtained from the N-bit counter 28 is stored in the register 2 of the register group 2. That is, the register R1 stores the error number ERROR during a period T1 (measuring time TER) of FIG. 4, and the register R2 stores that during a period T2 (measuring time TER) of FIG. 4.

The steps S2 through S4 are repeated until the identification number I reaches N. When I reaches N, the process proceeds to a step S5. By this time, the respective error numbers of the slip states 1 through N during each measuring time TER have already been stored in the registers R1 through RN of the register group 2, respectively.

At the step S5, the comparator 4 receiving the comparison starting signal CMP1 for activation from the slip state control portion 1 (at t1 of FIG. 4) outputs the minimum slip state MINSLIP, indicating the slip state k corresponding to the register Rk (k=any of 1 through N) which stores the minimum error number out of all the error numbers stored in the registers R1 through RN, respectively, to the slip state determination portion 5 as a candidate for the setting slip state of the depuncture circuit 21.

In the slip state determination portion 5, at a step S6, if the minimum slip state MINSLIP does not continuously indicate the same slip state M times (M≧1), the process returns to the step S1 to take a further error measurement of the slip states 1 through N (or accumulation of error numbers); if the minimum slip state MINSLIP continuously indicates the same slip state M times, the process proceeds to a step S7.

At the step S7, the slip state determination portion 5 determines the minimum slip state (information) MINSLIP, which has continuously indicated the same slip state M times, as the determined slip state (information) DSLIP, and outputs the DSLIP to the slip request output portion 6. FIG. 4 shows the case where M=1, that is, when the minimum slip state MINSLIP is immediately determined to be the determined slip state DSLIP (or when the answer of the step S6 is always "yes").

At a step S8, the slip request output portion 6 receiving the determined slip state DSLIP keeps outputting the "H"-level signal SLIP-REQUEST to change a slip state until the present slip state NOWSLIP obtained from the slip state control portion 1 agrees with the determined slip state DSLIP. When they agree with each other, the signal SLIP-REQUEST is switched to a "L" lever to fix a slip state. FIG. 4 shows the case where the determined slip state DSLIP is the slip state 2. Thus, the signal SLIP-REQUEST falls at the time t2 so that the depuncture circuit 21 is fixed in the slip state 2.

As described above, when the bit synchronous control circuit 10 is activated, the viterbi decoding apparatus of the first preferred embodiment sets the depuncture circuit 21 in the slip state continuously having the minimum error number M times as indicated by the determined slip state DSLIP.

In the viterbi decoding apparatus of the first preferred embodiment, since the slip state of the depuncture circuit 21 is set not by the absolute comparison between the decoding error number of the present slip state and the threshold value as in the conventional apparatus but by the relative comparison of the respective error numbers of all the slip states, the depuncture circuit 21 can be always accurately synchronized with the input of the convolutional code CC irrespective of the degree of noise in the transmission path of the convolutional code CC.

Besides, since the slip state of the depuncture circuit 21 is determined by the relative comparison of the error numbers of all the slip states, the measuring time TER can be shortened to about 1/100 of the conventional measuring time. Thus, even though the minimum slip state MINSLIP has to be obtained M times (highly possibly N×M<100), the time to set the slip state of the depuncture circuit 21 can be shortened.

Since the register group 2 stores the error numbers of all the slip states, the comparator 4 only has to make a relative comparison one time to obtain the minimum slip state MINSLIP.

Moreover, the slip state determination circuit 5 determines the slip state indicated by the minimum slip state MINSLIP as the determined slip state DSLIP, when the minimum slip state MINSLIP continuously indicates the same slip state M times (M≧1). Thus, if the determined slip state DSLIP becomes more reliable in proportion to the number M, the viterbi decoding apparatus of the first preferred embodiment can be more accurately synchronized with the input of the convolutional code CC.

2. Second Preferred Embodiment 2-1. Internal Structure

Figure 5:
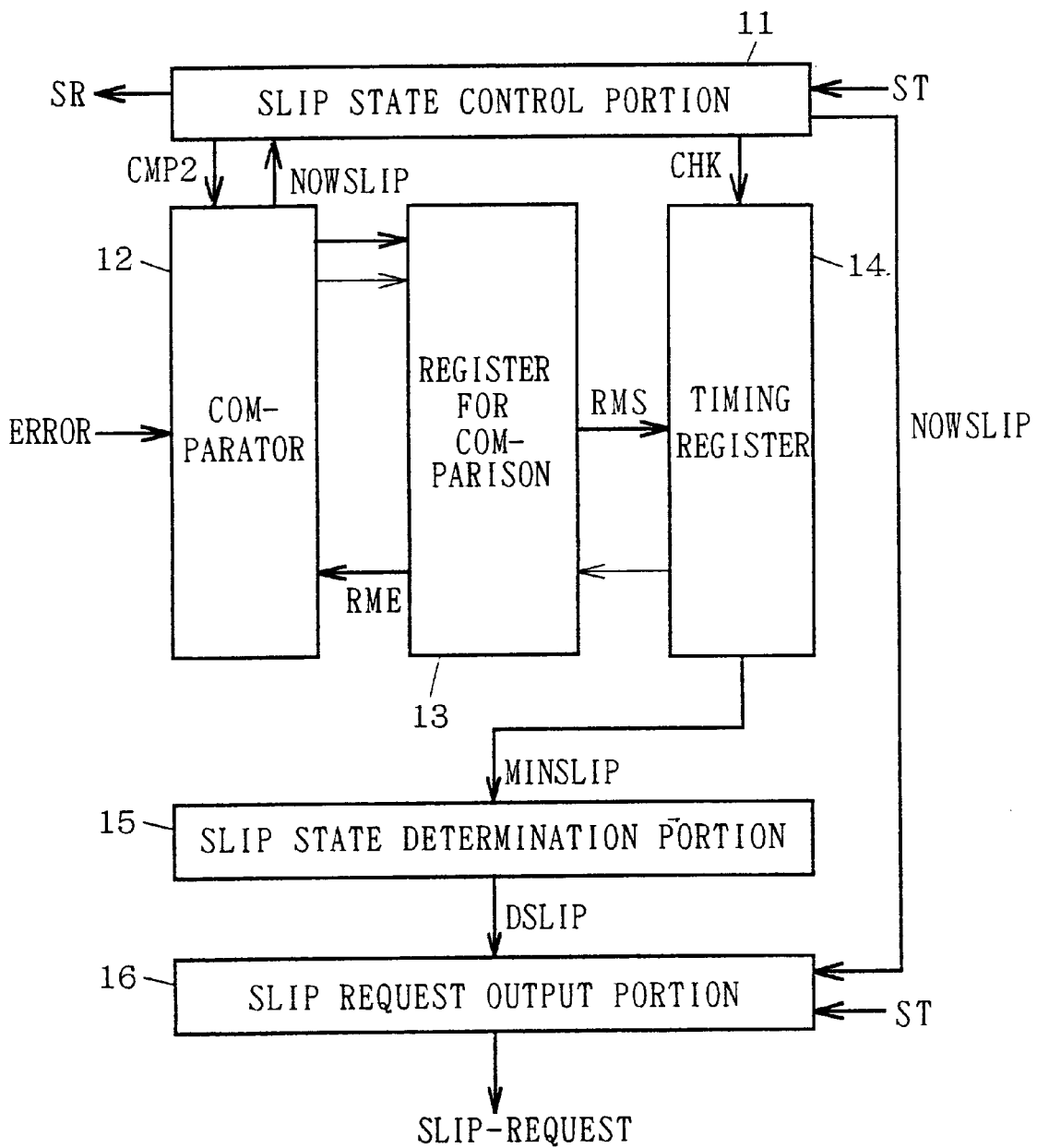
FIG. 5 shows the internal structure of a bit synchronous control circuit in accordance with a second preferred embodiment of the present invention.

FIG. 5 shows the internal structure of a bit synchronous control circuit 20 in the viterbi decoding apparatus of a second preferred embodiment of the present invention. The whole structure of this viterbi decoding apparatus is almost the same with that of the first preferred embodiment but different only in that the bit synchronous control circuit 10 is substituted by the bit synchronous control circuit 20.

As is the case with the bit synchronous control circuit 10, the bit synchronous control circuit 20 is activated or deactivated by the control signal ST. Receiving the error number ERROR from the N-bit counter 28, the bit synchronous control circuit 20 outputs the signal SLIP-REQUEST to the depuncture circuit 21 to change or fix a slip state, and initializes the N-bit counter 28 by the reset signal SR. In the inactive state, the bit synchronous control circuit 20 always outputs the "L"-level signal SLIP-REQUEST to fix a slip state as is the case with the synchronous control circuit 10.

A slip state control portion 11, having a timer (not shown) inside, is activated from a predetermined initial state by the control signal to output the present slip state NOWSLIP indicating the present slip state to a slip request output portion 16 on the basis of the slip state which changes every measuring time TER. Further, in the active state, synchronized with a change timing of the slip state, the slip state control portion 11 outputs a comparison starting signal CMP2 for activation to a comparator 12, and the reset signal SR to the N-bit counter 28 to initialize the counter. When the measurement of the error numbers ERROR of all the slip states is terminated, the slip state control portion 11 outputs a timing control signal CHK to a timing register 14 to output the minimum slip state MINSLIP.

A register for comparison 13 storing an error number for comparison RME and a slip state information for comparison RMS outputs the error number for comparison RME to the comparator 12 and the slip state information for comparison RMS to the timing register 14. Further, when receiving an initial signal from the timing register 14, the register for comparison 13 initializes the error number for comparison RME and the slip state information for comparison RMS.

The comparator 12 activated by the comparison starting signal CMP2 makes a comparison between the present error number ERROR and the error number for comparison stored in the register for comparison 13, and when the present error number ERROR is smaller than the error number for comparison, updates the error number for comparison and the slip state information for comparison stored in the register for comparison 13 to the error number ERROR and its corresponding slip state (information) NOWSLILP.

The timing register 14 outputs the slip state information for comparison RMS stored therein as the minimum slip state (information) MINSLIP to a slip state determination portion 15, when receiving the timing control signal CHK to output the minimum slip state MINSLIP. At the same time, the timing register 14 outputs an initialization signal to the register for comparison 13. This minimum slip state MINSLIP becomes an candidate for the setting slip state of the depuncture circuit 21.

Receiving the minimum slip state MINSLIP, the slip state determination portion 15 determines the minimum slip state (information) MINSLIP as the determined slip state (information) DSLIP, when the minimum slip state MINSLIP continuously indicates the same slip state M times (M≧1).

The slip request output portion 16 is activated by the control signal ST to start outputting the "H"-level signal SLIP-REQUEST to change a slip state. On the other hand, when deactivated by the control signal ST, the slip request output portion 16 always outputs the "L"-level signal SLIP-REQUEST to fix a slip state. The "H"-level signal SLIP-REQUEST changes the slip state of the depuncture circuit 21 in every predetermined slip cycle. In this preferred embodiment, the slip cycle and the measuring time TER are set to be the same.

The slip request output portion 16 receiving the determined slip state DSLIP keeps outputting the "H"-level signal SLIP-REQUEST to change a slip state until the present slip state NOWSLIP agrees with the determined slip state DSLIP. When they agree with each other, the slip request output portion 16 outputs the "L"-level signal SLIP-REQUEST to fix a slip state.

2-2. Operation

Figure 6:
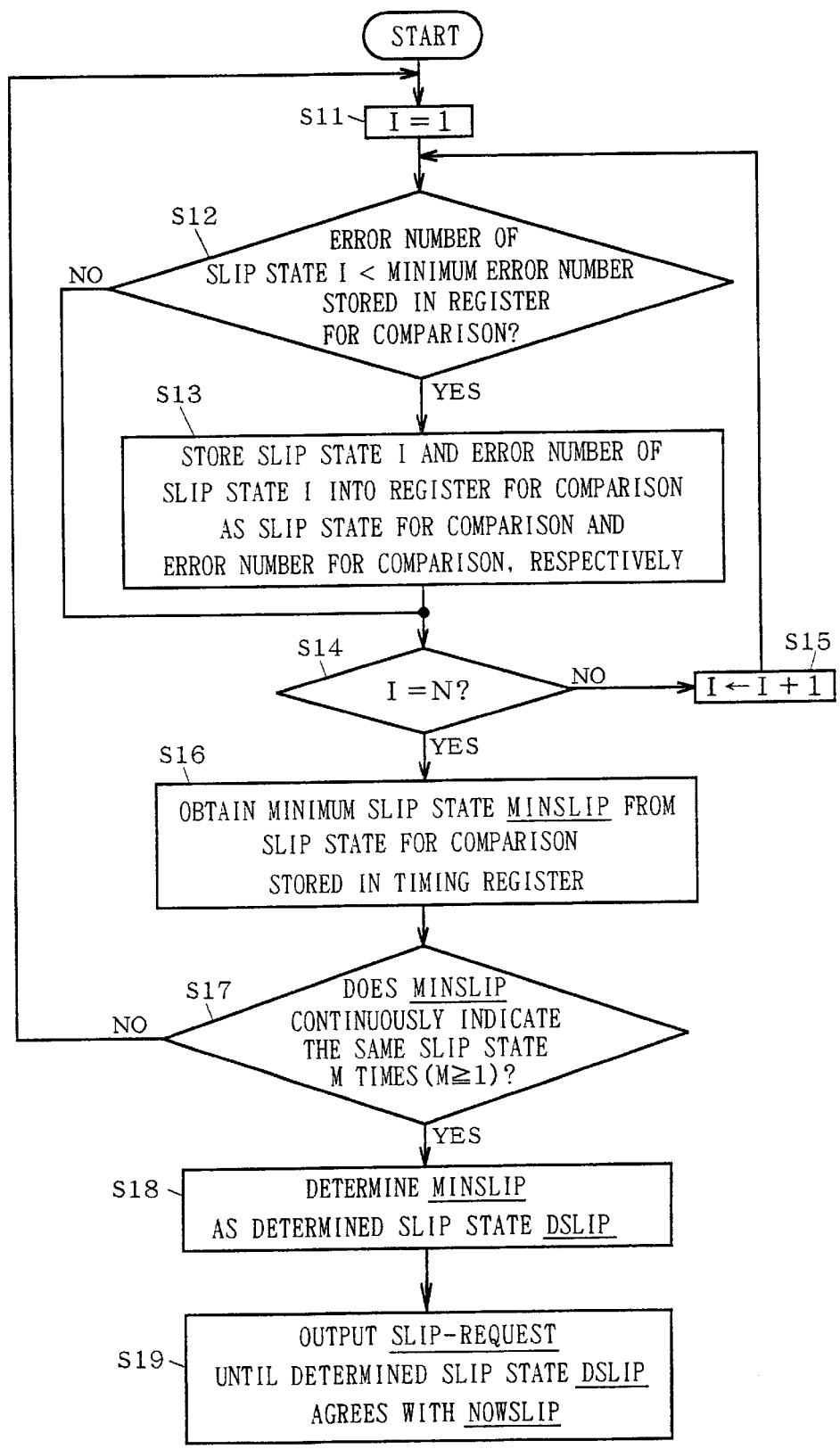
FIG. 6 is a flow chart illustrating the operation in accordance with the second preferred embodiment.
Figure 7:
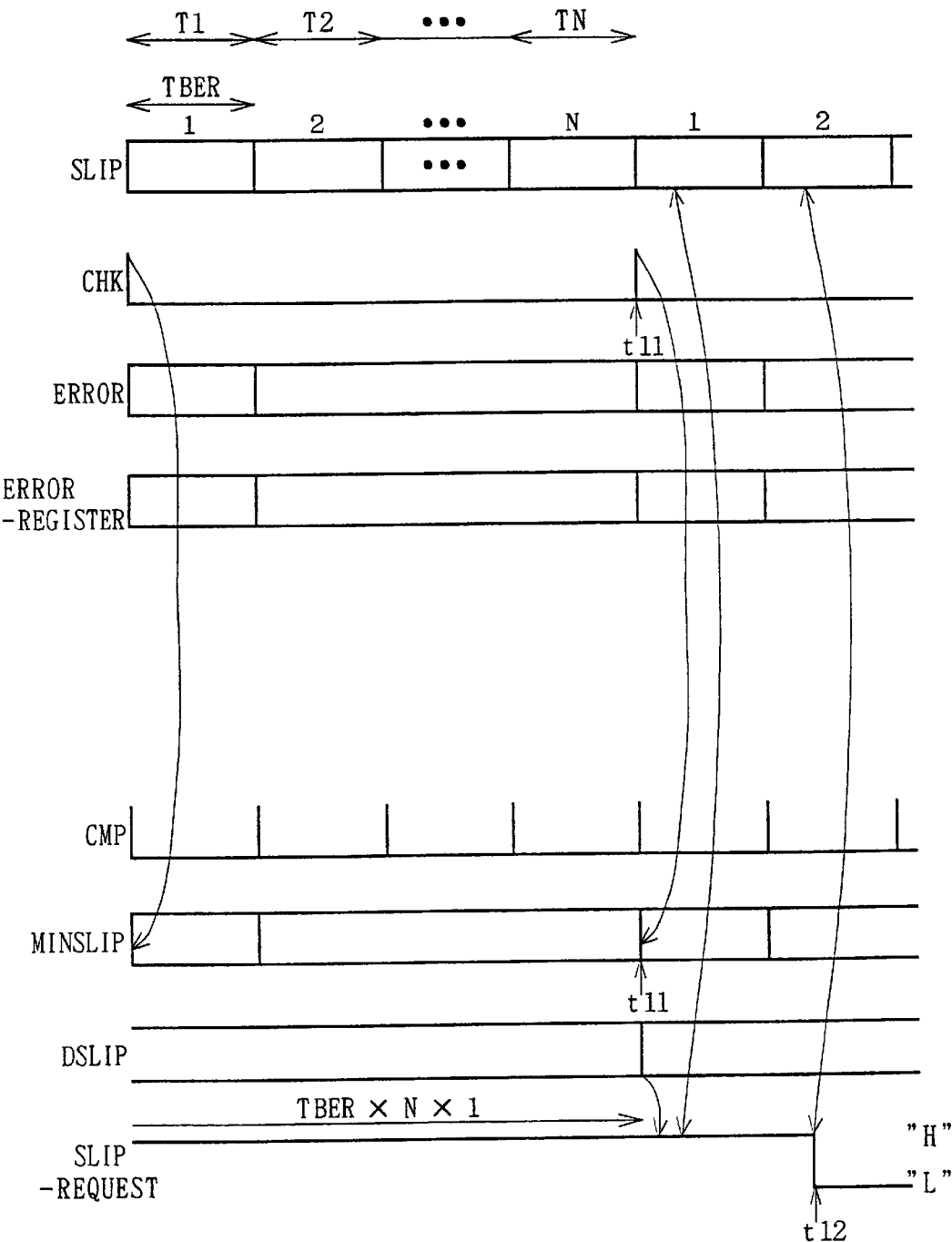
FIG. 7 is a timing chart illustrating the operation in accordance with the second preferred embodiment.

FIGS. 6 and 7 are a flow chart and a timing chart, respectively, both illustrating the operation of the bit synchronous control circuit 20 shown in FIG. 5. With reference to those figures, the operation of the active bit synchronous control circuit 20 will be described.

Initializing the slip state identification number I to "1" at a step S11, the slip state control portion 11 outputs the present slip state NOWSLIP indicating the slip state 1 and the comparison starting signal CMP2 for activation to the comparator 12, and initializes the N-bit counter 28 by the reset signal SR. At the same time, the slip state control portion 11 outputs the present slip state NOWSLIP to the slip request output portion 16.

At a step S12, the comparator 12 makes a comparison between the present error number ERROR with the error number for comparison RME. When the present error number is smaller, the comparator 12 updates the slip state information for comparison RMS and the error number for comparison RME stored in the register for comparison 13 to the slip state 1 and its corresponding error number. If the error number for comparison RME in the initial state of the register for comparison is large enough, the slip state 1 and its corresponding error number ERROR would unconditionally be stored as the slip state for comparison RMS and the error number for comparison RME.

In this case, since I≠N at a step S14, the identification number I is incremented by 1 (I+1) at a step S15. Then, the slip state control portion 11 outputs the present slip state NOWSLIP indicating the slip state 2 and the comparison starting signal CMP2 for activation to the comparator 12, and initializes the N-bit counter 28 by the reset signal SR. At the same time, the slip state control portion 11 outputs the present slip state NOWSLIP to the slip request output portion 16.

Again at the step S12, the comparator 12 makes a comparison between the present error number ERROR and the error number for comparison RME. When the present error number is smaller, the comparator 12 stores the slip state 2 and its corresponding error number as the slip state information for comparison RMS and the error number for comparison RME, respectively, at the step S13. When the present error number is larger, the process proceeds to the step S14, skipping the step S13.

The steps S12 through S15 are repeated until the identification number I reaches N. When I reaches N, the process proceeds to the step S16. At this time, the slip state k (k=either of 1 through N) corresponding to the minimum error number ERROR and the minimum error number ERROR are automatically stored in the register for comparison 13 as the slip state information for comparison RMS and the error number for comparison RME, respectively. The slip state information for comparison RMS stored in the comparison register 13 is also stored in the timing register 14.

At the step S16, receiving the timing control signal CHK to output the minimum slip state MINSLIP from the slip state control portion 11 (t11 of FIG. 7), the timing register 14 outputs the slip state information for comparison RMS as the minimum slip state (information) MINSLIP to the slip state determination portion 15, and initializes the register for comparison 13.

In the slip state determination portion 15, at a step S17, when the minimum slip state MINSLIP to be the candidate for the setting slip state of the depuncture circuit 21 does not continuously indicate the same slip M times (M≧1), the process returns to the step S11 to take a further error measurement of the slip states 1 through N (accumulation of error numbers ERROR); when the minimum slip state MINSLIP continuously indicates the same slip state M times, the process proceeds to a step S18.

At the step S18, the slip state determination portion 15 determines the minimum slip state (information) MINSLIP, which has continuously indicated the same slip state M times, as the determined slip state (information) DSLIP. FIG. 7 shows the case where M=1, that is, when the minimum slip state MINSLIP immediately becomes the determined slip state DSLIP (or the answer of the step S17 is always "yes").

Then, at a step S19, the slip request output portion 16 keeps outputting the "H"-level signal SLIP-REQUEST to change a slip state until the present slip state NOWSLILP obtained from the slip state control portion 11 agrees with the determined slip state DSLIP. When they agree with each other, the signal SLIP-REQUEST falls to a "L" level to fix a slip state. FIG. 7 shows the case where the determined slip state DSLIP is the slip state 2. Thus, the signal SLIP-REQUEST falls at a time t12 so that the depuncture circuit 21 is fixed in the slip state 2.

As described above, when the bit synchronous control circuit 20 is activated, the depuncture circuit 21 in the viterbi decoding apparatus of the second preferred embodiment is set in the slip state continuously having the minimum error number M times as indicated by the determined slip state DSLIP.

Since the slip state of the depuncture circuit 21 is set not by the absolute comparison between the decoding error number of the present slip state and the threshold value but by the relative comparison of the error numbers of all the slip states, the depuncture circuit 21 can be always accurately synchronized with the input of the convolutional code CC irrespective of the degree of noise in the transmission path. Besides, the time to set the slip state of the depuncture circuit 21 can be shortened as described in the first preferred embodiment.

In addition, the register for comparison 13 only has to have a capacity for storing one set of the error number for comparison RME and the slip state information for comparison RMS.

The slip state determination portion 15 determines the slip state indicated by the minimum slip state MINSLIP as the determined slip state DSLIP, when the minimum slip state MINSLIP continuously indicates the same slip state M times (M≧1). Thus, if the determined slip state DSLIP becomes more reliable in proportion to the number M, the viterbi decoding apparatus of the second preferred embodiment can be more accurately synchronized with the input of the convolutional code CC.

3. Modification

Figure 8:
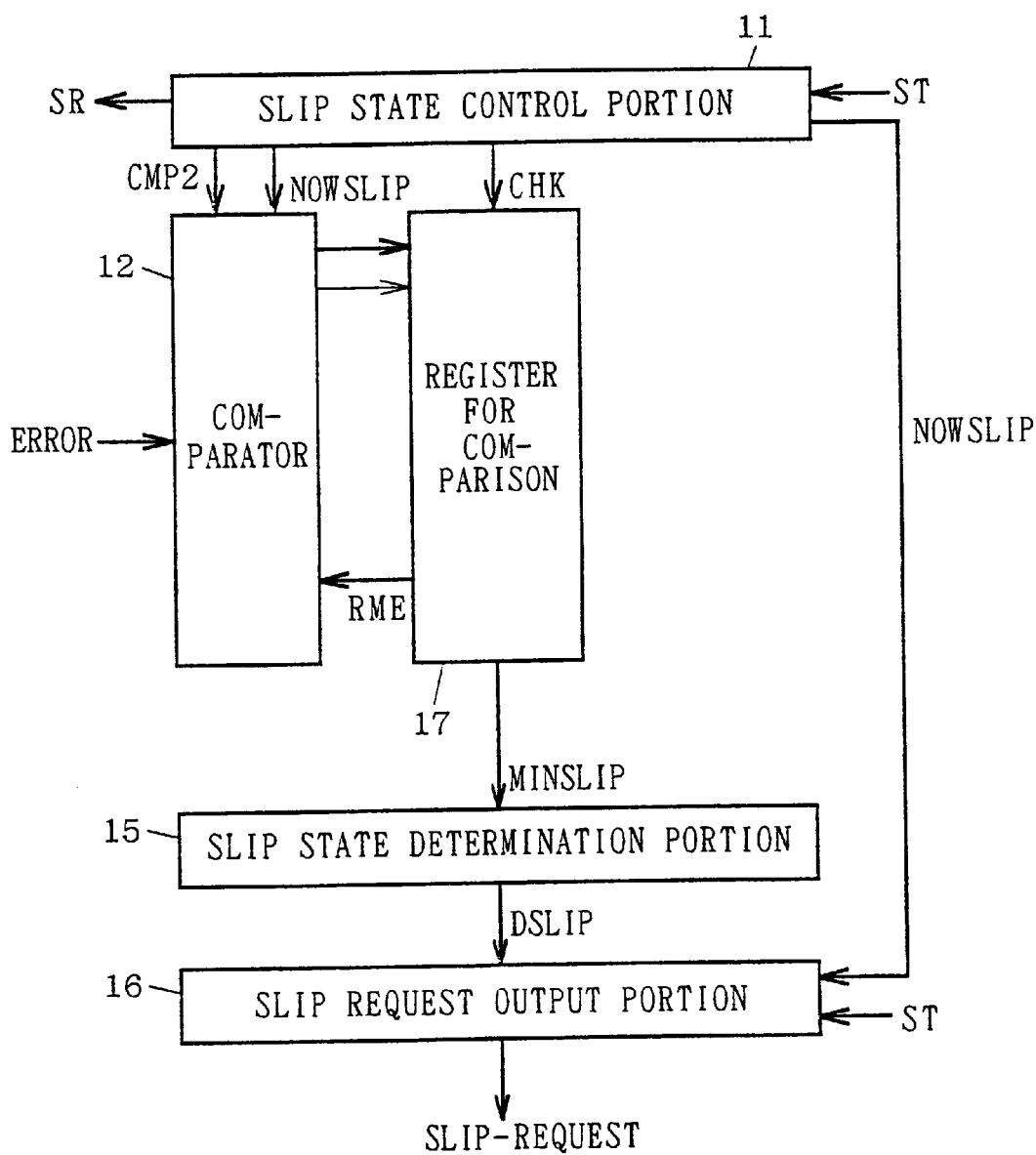
FIG. 8 shows a modification of the bit synchronous control circuit of the second preferred embodiment.

The bit synchronous control circuit 20 shown FIG. 5 may be substituted by the bit synchronous control circuit 30 shown in FIG. 8. Only the different point will be described.

Receiving the timing control signal CHK to output the minimum slip state MINSLIP, a register for comparison 17 outputs the slip state information for comparison RMS as the minimum slip state (information) MINSLIP to the slip state determination portion 15, and initializes the error number for comparison RME and the error slip state for comparison RMS.

The other operation of the register for comparison 17 is the same with that of the register for comparison 13 shown in FIG. 5. The use of the register for comparison 17 omits the timing register 14.

While the invention has been described in detail, the foregoing description is in all aspects illustrative and not restrictive. It is understood that numerous other modifications and variations can be devised without departing from the scope of the invention.

We claim:

1. A viterbi decoding apparatus comprising:
   a decoding processing portion for receiving a punctured convolutional code having an input timing, the input timing of the punctured convolutional code is based on a setting slip state, to decode said punctured convolutional code by a viterbi decoding method thereby to output a viterbi decoding data;
   a counting means for counting and outputting a decoding error number of said viterbi decoding data; and
   a synchronous control means for determining one of a plurality of slip states to be said setting slip state in an active state on the basis of said decoding error number, said synchronous control means including:
   an error-number-by-slip-state calculation means for obtaining respective decoding error numbers of said plurality of slip states from the output of said counting means by sequentially adopting said plurality of slip states as said setting slip state for each of predetermined periods of time, and for calculating decoding error numbers for said plurality of slip states; and
   a slip state setting means for setting said setting slip state on the basis of a comparison of respective decoding error numbers of said plurality of slip states relative to one another.

2. The viterbi decoding apparatus according to claim 1, wherein
   said counting means starts to count said decoding error number from an initial condition;
   said error-number-by-slip-state calculation means includes a control means for initializing said counting means for each of said predetermined periods of time, and outputting an error number calculation termination information indicating a termination of a calculation of said decoding error numbers of all said plurality of slip states upon said termination; and
   said slip state setting means includes:
   a storage portion for storing respective decoding error numbers of said plurality of slip states in one-to-one correspondence with said plurality of slip states;
   a comparison portion for making a relative comparison of respective decoding error numbers of said plurality of slip states stored in said storage portion to output a minimum slip state information indicating a slip state corresponding to the minimum decoding error number, when said error number calculation termination information indicates the termination of the calculation of said decoding error numbers of all said plurality of slip states; and a slip state determination portion for determining said setting slip state on the basis of said minimum slip state information.

3. The viterbi decoding apparatus according to claim 2, wherein
said error-number-by-slip-state calculation means repeats the calculation of respective decoding error numbers of all said plurality of slip states; and
said slip state determination portion determines the slip state indicated by said minimum slip state information as said setting slip state, when said minimum slip state continuously indicates the same slip state M times (M≧1).

4. The viterbi decoding apparatus according claim 1, wherein
said counting means starts to count said decoding error number from an initial condition;
said error-number-by-slip-state calculation means includes a control means for initializing said counting means for each of said predetermined periods of time, and outputting an error number calculation termination information indicating a termination of a calculation of said decoding error numbers of all said plurality of slip states upon said termination; and
said slip state setting means includes:
a storage portion for comparison for storing a slip state information for comparison and an error number for comparison;
a comparison portion sequentially receiving respective decoding error numbers of said plurality of slip states, for making a comparison between said decoding error number and said error number for comparison stored in said storage portion for comparison, to update said error number for comparison and said slip state information for comparison to said decoding error number and its corresponding slip state information when said decoding error number is smaller than said error number for comparison;
a minimum slip state output portion for outputting said slip state information for comparison finally stored in said storage portion for comparison as a minimum slip state information, when said error number calculation termination information indicates the termination of the calculation of said decoding error numbers of all of said plurality of slip states; and
a slip state determination portion for determining said setting slip state on the basis of said minimum slip state information.

5. The viterbi decoding apparatus according to claim 4, wherein
said error-number-by-slip-state calculation means repeats the calculation of respective decoding error numbers of all of said plurality of slip states; and
said slip state determination portion determines the slip state indicated by said minimum slip state information as said setting slip state, when said minimum slip state information continuously indicates the same slip state M times (M≧1).

6. A method for controlling a slip state of a convolutional code in a viterbi decoding apparatus having a plurality of slip states to be candidates for a setting slip state,
said viterbi decoding apparatus comprising:
a decoding processing portion for receiving a punctured convolutional code having an input timing, the input timing of the punctured convolutional code is based on said setting slip state, to decode the punctured convolutional code by a viterbi decoding method thereby to output a viterbi decoding data; and
a counting means for counting a decoding error number of said viterbi decoding data,
said controlling method comprising the steps of:
(a) obtaining respective decoding error numbers of said plurality of slip states by sequentially adopting said plurality of slip states as said setting slip state for each of predetermined periods of time; and
(b) setting said setting slip state on the basis of a comparison of respective decoding error numbers of said plurality of slip states relative to one another after said step (a).

7. The method for controlling the slip state of a convolutional code in the viterbi decoding apparatus according to claim 6, wherein
said step (a) includes the step of:
(a-1) storing respective decoding error numbers of said plurality of slip states in a storage portion in one-to-one-correspondence with said plurality of slip states,
said step (b) includes the steps of:
(b-1) making a relative comparison of respective decoding error numbers of said plurality of slip states stored in said storage portion to obtain a minimum slip state information indicating a slip state corresponding to the minimum decoding error number; and
(b-2) determining said setting slip state on the basis of said minimum slip state information.

8. The method for controlling the slip state of the convolutional code in the viterbi decoding apparatus according to claim 7, wherein
said steps (a) and (b) are repeated; and
said step (b-2) includes the step of:
(b-2-1) determining the slip state indicated by said minimum slip state information as said setting slip state, when said minimum slip state information continuously indicates the same slip state M times (M≧1), said minimum slip state information being obtained at every step (a).

9. The method for controlling the slip state of the convolutional code in the vitervi decoding apparatus according to claim 6, wherein
said step (a) includes the step of:
(a-1) sequentially receiving respective decoding error numbers of said plurality of slip states to make a comparison between said decoding error number and an error number for comparison thereby to update said error number for comparison and a slip state information for comparison to said decoding error number and its corresponding slip state information when said decoding error number is smaller than said error number for comparison, and
said step (b) includes the steps of:
(b-1) determining said slip state information for comparison obtained after said step (a) as a minimum slip state information; and
(b-2) determining said setting slip state on the basis of said minimum slip state information.

10. The method for controlling the slip state of the convolutional code in the viterbi decoding apparatus according to claim 9, wherein
said steps (a) and (b) are repeated; and
said step (b-2) includes the step of:
(b-2-1) determining the slip state indicated by said minimum slip state information as said setting slip state, when said minimum slip state information continuously indicates the same slip state M times (M≧1), said minimum slip state information being obtained at every step (a).

11. A slip state control apparatus for controlling a slip state of a punctured convolutional code in a viterbi decoding apparatus for counting a decoding error number of a viterbi decoding data, an input timing of said punctured convolutional code being based on a setting slip state, said slip state control apparatus comprising:
an error-number-by-slip-state calculation means for obtaining respective decoding error numbers of said plurality of slip states by sequentially adopting said plurality of slip states as said setting slip state for each of predetermined periods of time, and for calculating decoding error numbers for said plurality of slip states; and a slip state setting means for setting said setting slip state on the basis of a comparison of respective decoding error numbers of said plurality of slip states relative to one another.

* * * * *